United States Patent
Toyomura et al.

[11] Patent Number: 6,066,797
[45] Date of Patent: May 23, 2000

[54] SOLAR CELL MODULE

[75] Inventors: Fumitaka Toyomura, Kyoto; Makoto Sasaoka, Kyotanabe, both of Japan

[73] Assignee: Canon Kabushiki Kaisha, Tokyo, Japan

[21] Appl. No.: 09/045,954

[22] Filed: Mar. 23, 1998

[30] Foreign Application Priority Data

Mar. 27, 1997 [JP] Japan .................................. 9-075507

[51] Int. Cl.⁷ .................................................. H01L 31/05
[52] U.S. Cl. .......................... 136/251; 136/244; 136/256; 136/259; 52/173.3; 126/623; 126/569; 126/704; 126/705; 438/64; 438/66; 438/98; 438/57; 438/83; 257/433
[58] Field of Search .................................. 136/251, 244, 136/256, 259; 52/173.3; 126/623, 569, 704, 705; 438/64, 66, 98, 57, 83; 257/433

[56] References Cited

U.S. PATENT DOCUMENTS

| | | | |
|---|---|---|---|
| 5,110,369 | 5/1992 | Tornstrom et al. | 136/251 |
| 5,268,038 | 12/1993 | Riermeier et al. | 136/251 |
| 5,280,133 | 1/1994 | Nath | 174/52.1 |
| 5,503,684 | 4/1996 | Duran | 136/251 |

FOREIGN PATENT DOCUMENTS 7-273361  10/1995  Japan .

*Primary Examiner*—Alan Diamond
*Attorney, Agent, or Firm*—Fitzpatrick, Cella, Harper & Scinto

[57] ABSTRACT

The object of this invention is to provide a solar cell module having a terminal extracting structure for it, with high adhesion workability, high productivity, and high reliability. The solution to this object is a solar cell module wherein a box member having therein an electrical connecting portion between a solar cell element and an outer lead wire is adhered to the solar cell module with a pressure-sensitive adhesive, and a lid member is adhered to the solar cell module with an adhesive so as to cover the box member.

43 Claims, 8 Drawing Sheets

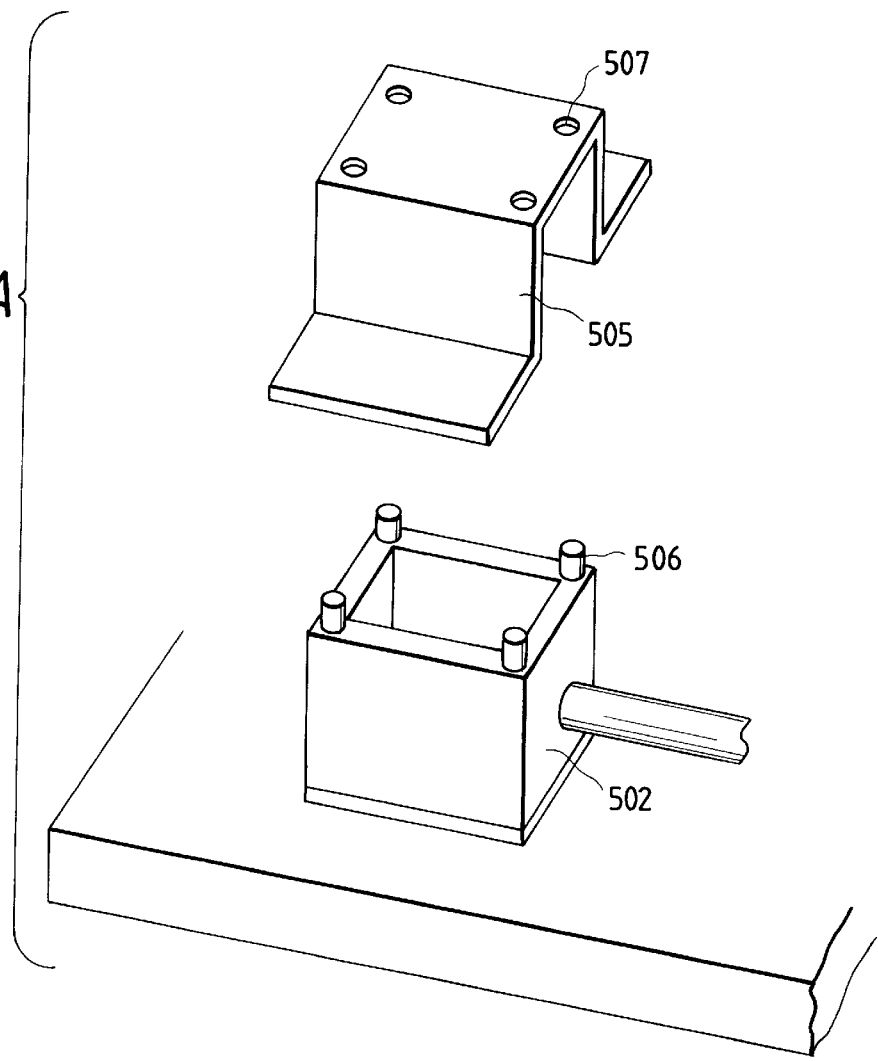
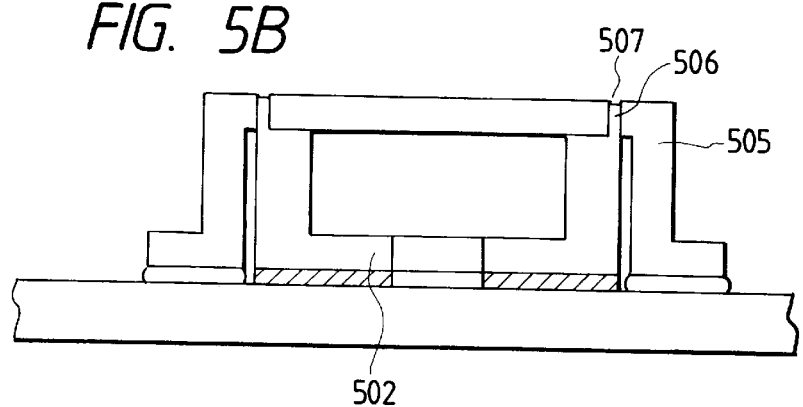

SOLAR CELL MODULE

BACKGROUND OF THE INVENTION

1. Field of the Invention

The present invention relates to a terminal extracting structure for a solar cell module and, more particularly, to a terminal box which is to be attached to a solar cell module and which has improved attaching workability and adhesion reliability.

2. Related Background Art

A solar cell module is conventionally known in which a solar cell element is sealed with a resin on a reinforcing plate, e.g., a steel sheet or a glass sheet, and is further covered with a protective film. As the protective film, a weather-resistant film such as a glass or fluoroplastic film is used.

As the solar cell element, a crystalline silicon solar cell, a polysilicon solar cell, an amorphous silicon solar cell, a copper indium selenide solar cell, a compound semiconductor solar cell, and the like are available. Of these solar cells, thin-film crystalline silicon solar cell, compound semiconductor solar cell, and amorphous silicon solar cell are recently studied and developed extensively in various fields as they can be formed to have a large area at a comparatively low cost.

As the lower surface reinforcing material of the solar cell module, a weather-resistant, moisture-resistant film obtained by sandwiching an aluminum foil with weather-resistant films, a thin steel sheet, e.g., non-coated zinc-plated steel sheet, a steel sheet which is coated with a polyester resin or acrylic resin so as to have high flexibility and hardness, a plastic sheet, or the like is used.

The output terminal of the solar cell module is connected with a screw, a lead wire, or a socket. In any case, a terminal box having a water-proof structure is often provided for the purpose of insulation. Such a terminal box is adhered to the lower surface of the solar cell module with a double-sided adhesive tape or is mounted on it with an adhesive, e.g., silicone sealant. In the former case, the mounting operation is very simple, and a desired original adhesion strength can be easily obtained by determining the pressure to be applied.

Japanese Laid-Open Patent Application No. 7-273361 describes a solar cell module obtained by sealing a solar cell element on a steel sheet with a resin, adhering a terminal box for obtaining power from the prospective solar cell module covered with a protective film, to the solar cell element with a double-sided adhesive tape, and successively filling the terminal box with a filler through a through hole formed in the terminal box.

When the terminal box is adhered only with the double-sided adhesive tape, a sufficiently large holding force cannot be obtained under a high humidity and a high temperature. The adhesion strength of the terminal box onto the solar cell module may be decreased due to expansion of the internal air or the like. When the terminal box is adhered with an adhesive, after the terminal box is mounted, the adhesive must be sufficiently solidified so that the terminal box will not separate in the solar cell module inspecting process, leading to a poor productivity.

When the terminal box is fixed by adhesion while employing the double-sided adhesive tape as well for the purpose of preliminary fixing, in particular, when a compact terminal box having a small adhesion surface is mounted, the adhesive may undesirably enter the gap between the double-sided adhesive tape and the solar cell module. Then, an adhesion strength necessary for sending the solar cell module to the inspection/wrapping process cannot be obtained, and the terminal box may be dislocated on the adhesion surface of the solar cell module or the adhesion strength may be decreased. When the adhesive enters the gap in this manner, the adhesive does not sufficiently spread over the adhesion surface, and an adhesion strength necessary in terms of design cannot be obtained.

SUMMARY OF THE INVENTION

It is an object of the present invention to provide a solar cell module having a solar cell module terminal extracting structure, in which the drawbacks described above are solved, and which has high adhesion workability, high productivity, and high reliability.

There is provided a solar cell module wherein a box member having therein an electrical connecting portion between a solar cell element and an outer lead wire is adhered to the solar cell module with a pressure-sensitive adhesive, and a lid member is adhered to the solar cell module with an adhesive so as to cover the box member.

A method of manufacturing this solar cell module comprises the steps of adhering a box member having an opening portion in a bottom surface thereof to the solar cell module with a pressure-sensitive adhesive, electrically connecting an outer lead wire connected to a side surface of the box member to an output terminal of the solar cell module, and adhering, with an adhesive, a lid member which overlaps the box member at least partially and is fixed on the solar cell module with an adhesive.

There is also provided a solar power generation apparatus comprising a solar cell module and an inverter for controlling an output from the solar cell module, the solar cell module being arranged such that a box member having therein an electrical connecting portion between a solar cell element and an outer lead wire is adhered to a solar cell module with a pressure-sensitive adhesive, and a lid member is adhered to the solar cell module with an adhesive so as to cover the box member.

BRIEF DESCRIPTION OF THE DRAWINGS

FIGS. 5A and 5B show the structure of a terminal box for a solar cell module according to the present invention;

DETAILED DESCRIPTION OF THE PREFERRED EMBODIMENTS

Figure 1:
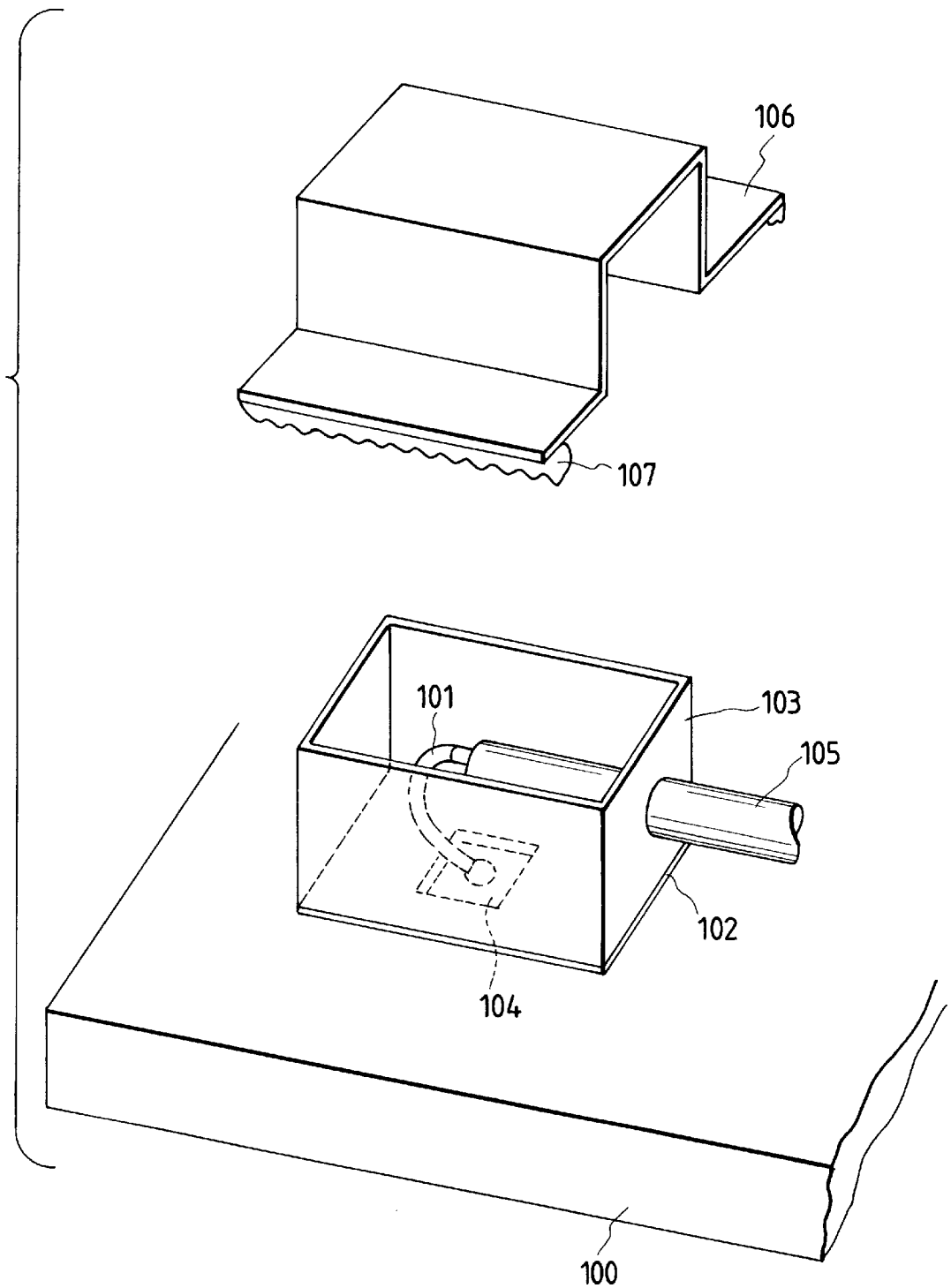
FIG. 1 shows the structure of a terminal box for a solar cell module according to the present invention.
Figure 2:
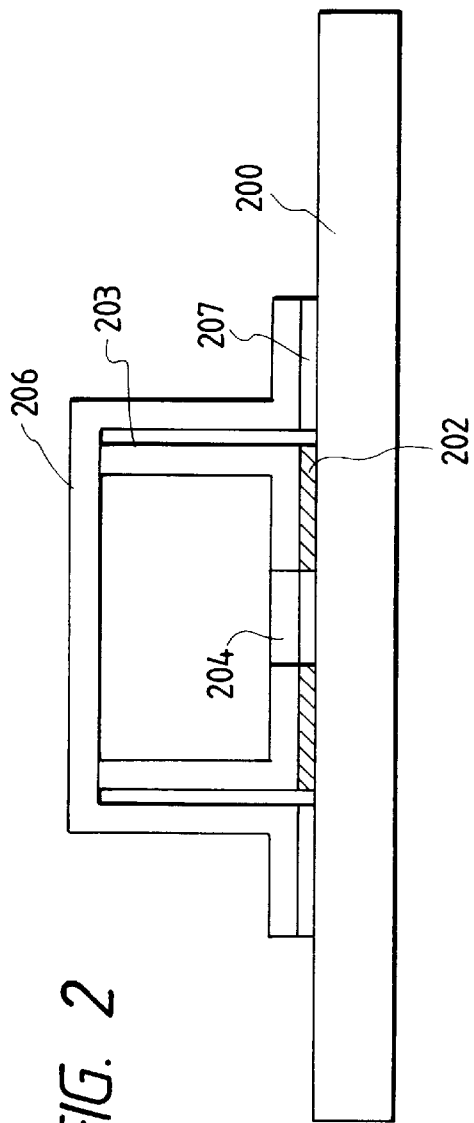
FIG. 2 shows the structure of the terminal box for the solar cell module according to the present invention.

FIG. 1 is a perspective view of a terminal box for a solar cell module to which the present invention is applied, and FIG. 2 is a sectional view of the same.

The terminal box of the present invention is constituted by a box member 103 and a lid member 106. The box member 103 is hollow and has an open upper surface. The box member 103 also has an opening portion 104 in its lower surface which is to be connected to the electric connecting portion of a solar cell module 100. The side surface of the box member 103 has an opening through which an outer lead wire 105 extends. The outer lead wire 105 is connected to an inner lead wire 101 and is electrically connected to the output terminal of the solar cell module 100 through the opening portion in the side surface of the box member 103. The box member 103 is adhered to the solar cell module 100 with a pressure-sensitive adhesive 102. As the pressure-sensitive adhesive 102, a double-sided adhesive tape is suitably used. Since the box member 103 is adhered with the pressure-sensitive adhesive, the inspection process can be started immediately after this. The pressure-sensitive adhesive 102 is arranged to surround the four sides of the box member 103 so as not to cover the opening portion 104 through which electrical connection is made. Hence, when the box member 103 is to be filled with a filler having a low viscosity, the filler can be prevented from leaking to the outside through the opening portion 104.

If the inner lead wire 101 is connected to the output terminal of the solar cell module in advance, the workability in connecting the outer lead wire and the output terminal of the solar cell module to each other is improved. Alternatively, the outer lead wire may be directly connected to the output terminal of the solar cell module.

After inspection process is ended, the lid member 106 is arranged to apply on the box member 103, and is adhered to the solar cell module with an adhesive 107. The adhesive may be applied also to the surfaces of the box member 103 and lid member 106 that come into contact with each other. The interior of the box member 103 may be filled with the filler. When the terminal box for the solar cell module 100 has this arrangement, the workability is improved when mounting the terminal box on the solar cell module 100. In particular, after the box member is mounted, the inspection process can be started immediately without waiting for the adhesive 107 to be dried, so that the work time in the manufacture line is greatly shortened. After this, the lid member 106 is adhered to perform insulation and mechanical protection of the electrical connecting portion.

FIG. 2 is a sectional view showing a state wherein a box member and a lid member are fixed to a solar cell module. A box member 203 is adhered to a solar cell module 200 with a pressure-sensitive adhesive 202, and a lid member 206 is fixed to the solar cell module 200 with an adhesive 207 to overlap the box member 203. An adhesive may be applied between the lid member 206 and box member 203. An opening portion 204 is formed in the box member 203, and the power extracting portion of the solar cell module 200 and an outer lead wire are electrically connected to each other through the opening portion 204.

Figure 3:
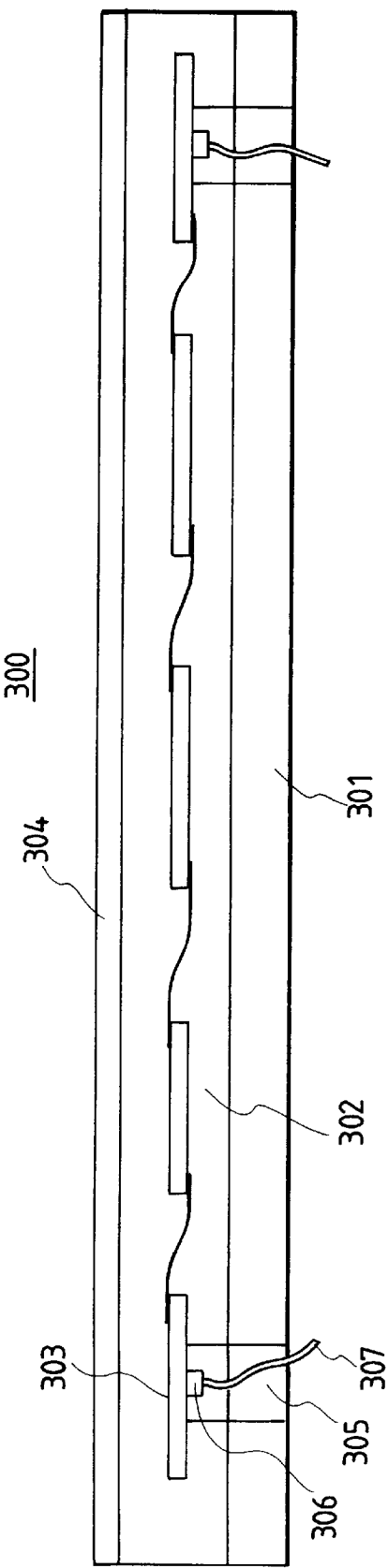
FIG. 3 shows an example of the solar cell module according to the present invention.

FIG. 3 shows an example of a solar cell module to which the terminal box described above can be applied. A lower surface reinforcing material, a filler sheet, series-connected solar cell elements, a filler sheet, and a weather-resistant film are stacked in the order named, and are sealed by using a vacuum laminator. The resultant structure is heated to fuse the filler. As a result, as shown in FIG. 3, a solar cell module 300 in which solar cell elements 303 are sealed on a reinforcing material 301 with a filler 302 and covered with a weather-resistant film 304 can be obtained. Reinforcing material opening portions 305 are formed in the reinforcing material 301, and output terminals 306 of the respective solar cell elements 303 are exposed to the outside through them. Each output terminal 306 is connected to a lead wire 307. The terminal box described above is mounted on the reinforcing material opening portions 305.

As the reinforcing material 301, a metal sheet, a plastic sheet, an FRP sheet, or the like can be used. As the filler 302, a transparent resin, e.g., EVA (vinyl acetate-ethylene copolymer), a butyral resin, a silicone resin, an epoxy resin, or a fluorinated polyimide resin can be used. It is also possible to crosslink the filler by adding a crosslinking agent to it. The filler preferably contains an ultraviolet light absorber in order to suppress deterioration by light. As the weather-resistant film 304, a fluoroplastic film made of, e.g., polyethylene tetrafluoroethylene (ETFE), polyethylene tetrafluoride, or polyvinyl fluoride, can be used. The adhesion surface where the filler is to be adhered may be subjected to surface treatment, e.g., corona discharge, so that the filler can be adhered easily. An insulating film may be interposed between the reinforcing material 301 and the solar cell elements 303. This aims at maintaining the electrical insulation of the solar cell elements. As the material suitably used as the insulating film, a plastic film made of nylon, polyethylene terephthalate (PET), or the like can be used.

The type of the solar cell elements 303 is not particularly limited, and a semiconductor junction, e.g., a semiconductor p-n junction made of a monocrystalline material, a pin junction made of a non-crystalline material, or a Schottky junction, may be used. As the semiconductor material, a silicon semiconductor material or compound semiconductor material is used.

Figure 8:
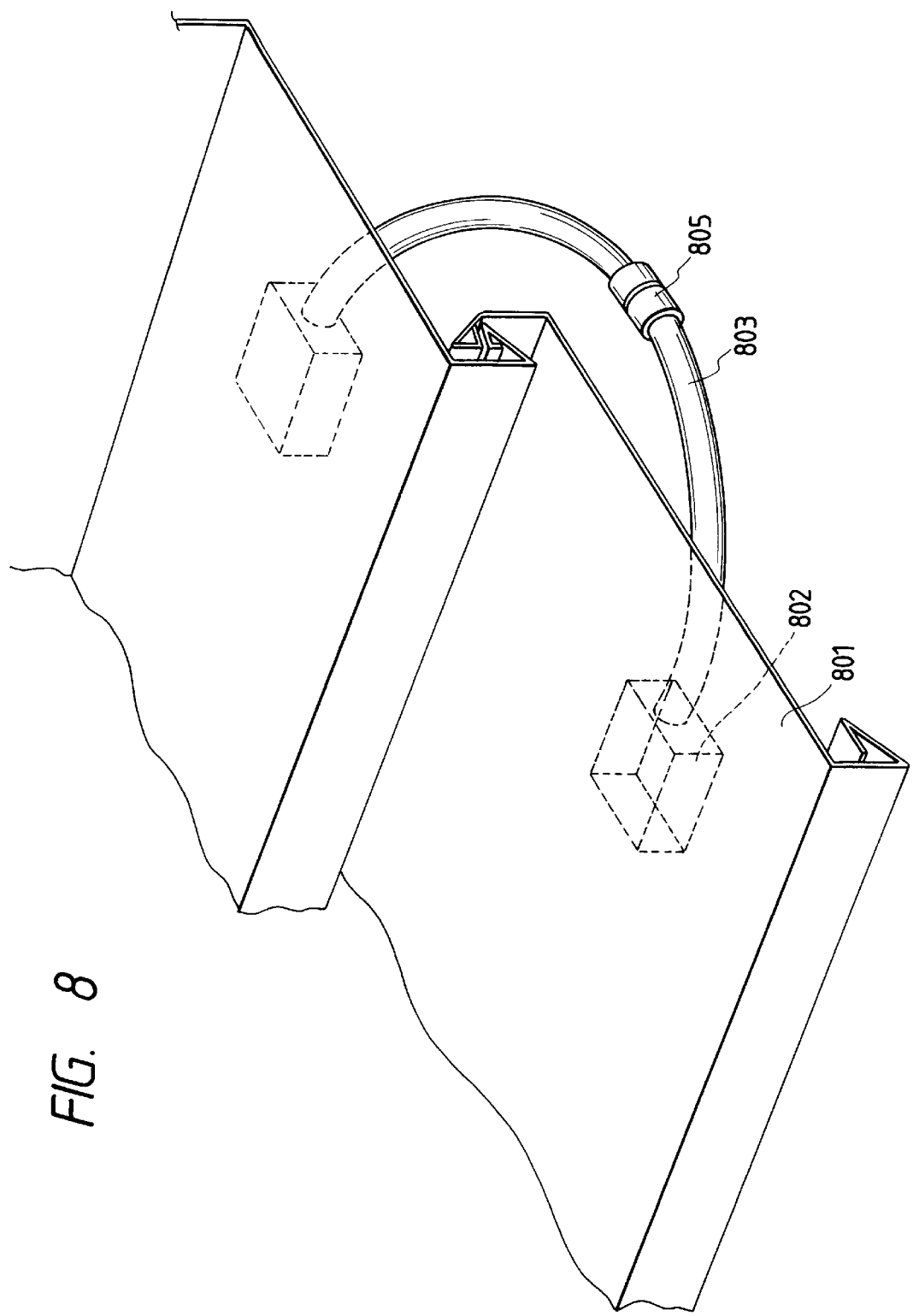
FIG. 8 shows an example in which the solar cell module according to the present invention is applied to a building material.

FIG. 8 shows an example in which the solar cell module described above is applied to a building material. A solar cell built-in building material can be obtained by bending the end portion of the reinforcing material 301 shown in FIG. 3. This can be applied to a roofing material, a walling material, and the like. For example, in FIG. 8, the two opposing sides of solar cell built-in building materials are bent such that they can be assembled together by fitting with each other. A terminal box 802 identical to that described above is arranged on the lower surface of each solar cell built-in building material 801, and an outer lead wire 803 for obtaining power from the solar cell is connected to the terminal box 802. The outer lead wires 803 of the solar cell modules that are assembled together by bending and fitting are electrically connected to each other through a connector 805.

The solar cell module is combined with an inverter to convert its electricity into an appropriate voltage or current. The inverter may have a function so that it is linked to the system power.

The members, pressure-sensitive adhesive, and adhesive used in the present invention will be described in more detail.

[Box Member and Lid Member]

As the box member and lid member used in the present invention, those having high heat resistance, high water resistance, high electrical insulation properties, and high aging resistance are required. A material having good adhesion properties with the adhesive is preferable.

When the above factors are considered, as the material of the box member and lid member, a plastic is preferable. When the fire retardancy is considered, a fire-retardant plastic or ceramic material is preferable. An example of the plastic includes engineering plastics such as polycarbonate, polyamide, polyacetal, modified PPO, modified PPE, polyester, polyarylate, unsaturated polyester, a phenol resin, and an epoxy resin, which have high strength, high impact resistance, high heat resistance, high hardness, and high aging resistance. A thermoplastic such as ABS resin, PP, or PVC can also be employed.

Carbon black is used as the pigment in order to improve the ultraviolet resistance. Alternatively, a resin coating that absorbs ultraviolet light is preferably applied on the surface of the box member and lid member.

[Adhesive]

As the material used for adhering the lid member or filling the box member in the present invention, an epoxy resin-based adhesive, a silicone-based potting agent, a silicone-based adhesive sealing agent, or the like having good electrical insulation is preferable. When flexibility and the like are considered, a silicone-based resin is more preferable. As the adhesive, when the workability is considered, one having a short hardening time, and furthermore one having a viscosity equal to or more than 300 poise is preferable. If the viscosity is excessively low, the adhesive may flow out from the box member. As the filler, one having a viscosity equal to or smaller than 1,000 poise, which is not excessively high, is preferable because it spreads out to even the narrow portion of the electrode extracting portion. When silicone one-pack type RTV rubber is used, the hardening method is preferably of deacetone type or dealcohol type so that the rubber does not erode the electrode.

For example, among the epoxy resin-based adhesives of Three Bond Co., Ltd., tradename: "2001", "2002H", "2003", "2016B", "2022", or the like can be used. Such an epoxy resin can be used by mixing a curing agent, e.g., tradename: "2102B", "2103", "2104", "2105F", "2105C", "2106", "2131B", "2131D", "2131F", or "2163" to it in a predetermined content.

Among the epoxy resins of Sumitomo 3M Ltd., "EW-2" (one-pack type), "S/W-2214" (one-pack type), "XA7416" (one-pack type), "JA7437" (one-pack type), "1838B/A" (two-pack type; the mixing ratio of the major agent to the curing agent=4:5), "S/W-2216B/A", "DP-100" (1:1), "DP-110" (1:1), "DP-190" (1:1), "DP-PURE60" (1:1), "DP-270" (1:1), or the like can be used.

Among the epoxy resins of Yuka Shell Epoxy K.K., major agent "Epikote" 812, 815, 827, 828, 834, or the like can be used. The curing agent can be selected in accordance with the required performance. As the silicone-based adhesive sealing agent, for example, "1220" or "1230" of Three Bond Co., Ltd., "SE 9156", "SE 9157", "SE 9166", "SE 9176", "SE 9185", "SE 9186", "SE 9186L", "SE 9187", "SE 1811", "SE 1740" (two-pack type), "SE 1821" (two-pack type), "CY 52-005" (two-pack type), "CY 51-038" (two-pack type), or "CY 51-019" (two-pack type) of Torei Dow-Corning Silicone K.K., "SILASTIC 739 RTV", "SILASTIC 738 RTV", "3140 RTV", or "3145 RTV" of Dow-Corning, "KE 347", "KE 3494", "KE 4897", "KE 4896", "KE 4895", "KE 66" (two-pack type), or "KE 67" (two-pack type) of Shin-Etsu Chemical Co., Ltd., or "TSE 392" "TSE 3925", "TSE 397", "TSE 3971", "TSE 3972", or "TSE 3975" of Toshiba Silicone K.K. can be used.

[Pressure-Sensitive Adhesive]

As the pressure-sensitive adhesive used for adhering the box member or lid member and the solar cell module to each other, a double-sided adhesive tape is suitably used. The double-sided adhesive tape is required to have a certain degree of thickness, high heat resistance, high cold temperature resistance, high adhesion strength, and high durability. Furthermore, the double-sided adhesive tape preferably has a high water-proof sealing performance and a large holding, force. For example, among VHB cementing agents of Sumitomo 3M Ltd., "Y-4959", "Y-4955", "Y-4950", "Y-4930", "Y-4920", "Y-4914", "Y-4945", "Y-4922", "Y-4952", "Y-4932", "Y-4951", "Y-4931", "Y-4949", "Y-4929", "Y-4910J", "Y-4627", "Y-4630F", "Y-4609", or "Y-4615" can be used.

Among the double-sided adhesive tapes of NICHIBAN CO., LTD., "831", "841", "843", "843-S", "844", "851", "853", or the like can be selected.

Furthermore, among the double-sided adhesive tapes of NITTO DENKO CORP., "No. 541", "No. 554", "No. 5710", "No. 5711", "No. 5713", "No. 575", "PF-370", or the like can be used.

EXAMPLES (Example 1)

Five amorphous solar cell elements were connected in series. A copper tab having an appropriate length was adhered to the lower surface of each solar cell element as the positive or negative terminal wire. Solder was applied to the distal end of the copper tab to form an electrode extracting portion. A glass cloth tape was adhered to the lower surface of the copper tab to improve the insulation properties.

By using these elements, the solar cell module shown in FIG. 3 was formed. An EVA sheet (ethylene-vinyl acetate copolymer; weather resistant grade) serving as a filler 302, solar cell elements 303, another EVA sheet 302, and ETFE (ethylene tetrafluoroethylene) serving as a weather-resistant film 304 were sequentially formed on a polyester resin-coated steel sheet (0.4-mm thick) serving as a lower surface reinforcing material 301, and were contact-bonded to each other by applying heat to them.

An opening portion 305 having a diameter of 15 mm was formed in the polyester resin-coated steel sheet described above in advance to extract the terminal. A 6-mm diameter hole was formed in the EVA sheet 302 in advance to correspond to the opening portion 305, and was plugged with a plug made of silicone rubber so that it would not be filled with molten EVA. After EVA was melted and hardened, the plug was removed from the opening portion 305 of the lower surface reinforcing material 301.

Finally, an output terminal 306 of the filler 302 was peeled with a cutter knife or the like to expose the electrode extracting portion, and a lead wire 307 (HKIV) from which an insulating coating of about 5 mm was removed in advance from the end was soldered to the exposed electrode extracting portion.

As shown in FIG. 1, the lead wire was passed through an opening portion 104 and was soldered to the power extracting portion of a solar cell module 100. The release paper of a double-sided adhesive tape 102 was removed from a box member 103 to which a double-sided adhesive tape 102 was adhered, and the box member 103 was adhered to a predetermined position of the solar cell module 100. An outer lead wire 105 was passed through a through hole formed in the side surface of the box member 103. A lead wire 101 was soldered to the outer lead wire 105 in the box member 103, so that the lead wire 101 was electrically connected to the outer lead wire 105. Then, output inspection of the solar cell module was performed. Thereafter, a surface of a lid member 106 which opposed the solar cell module was coated with silicone sealant "SILASTIC 739 RTV" 107 manufactured by Dow-Corning, and immediately after that, the lid member 106 was adhered to the solar cell module 100, thereby forming the terminal extracting portion for the solar cell module.

(Example 2)

Figure 4A:
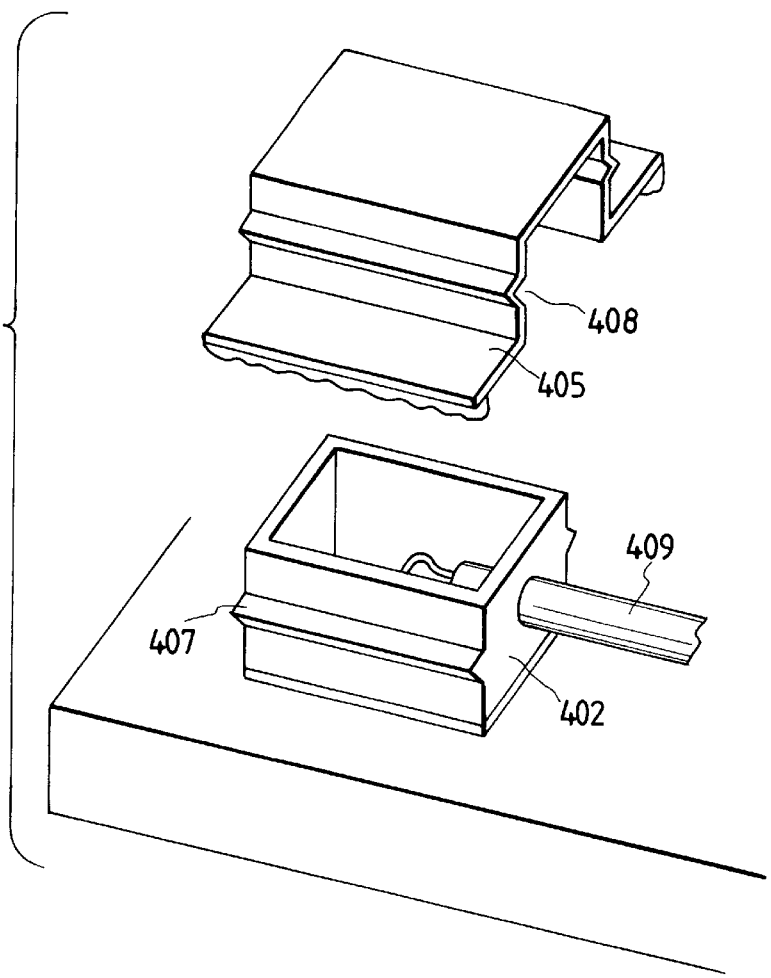
FIGS. 4A to 4C show the structure of a terminal box for a solar cell module according to the present invention.
Figure 4B:
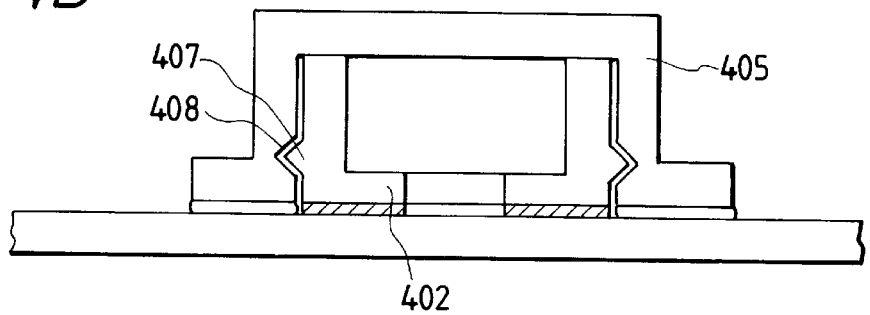
Figure 4C:
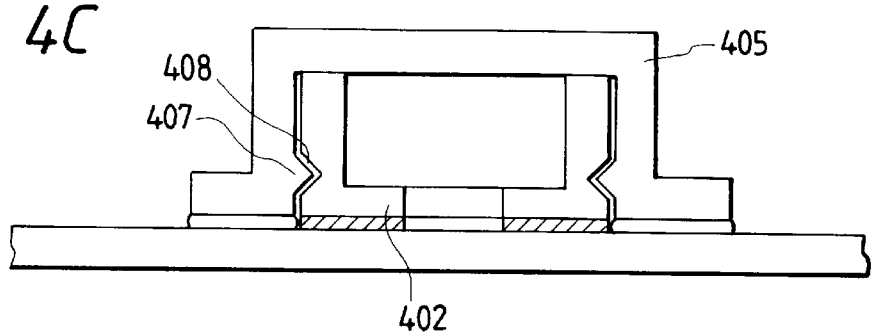

As shown in FIGS. 4A and 4B, locking projecting portions 407 were formed on a box member 402, and locking portions 408 were formed in a lid member 405. Except for this, Example 2 was identical to Example 1. Since the box member had the locking projecting portions, the lid member had the locking portions, and the locking projecting portions and locking portions locked each other when the lid member was mounted on a solar cell module 400 with an adhesive 406, the lid member was set and held still at the fixed position. As a result, the lid member did not displace or float from the box member or was not urged against the box member before the adhesive dried, and the adhesion force required by the design was reliably obtained. As shown in FIG. 4C, locking projecting portions 407 may be formed on the lid member.

(Example 3)

As shown in FIG. 5, projecting portions 506 were formed on part of the upper surface of a box member 502, and hole portions were formed in a lid member 507 to correspond to the projecting portions 506. Since the box member had the projecting portions, the lid member had the hole portions, and the locking projecting portions and hole portions fitted with each other when the lid member was mounted on a solar cell module 500 with an adhesive 508, the lid member was set and held still at the fixed position. As a result, the lid member did not displace or float from the box member or was not urged against the box member before the adhesive dried, and the adhesion force required by the design was reliably obtained.

(Example 4)

Figure 6:
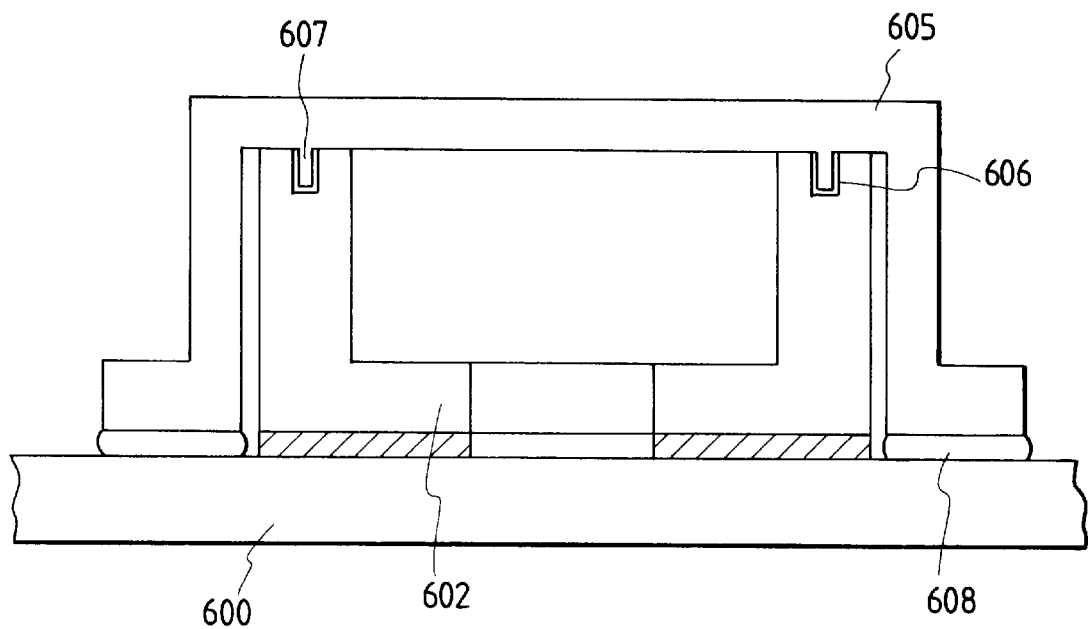
FIG. 6 shows the structure of a terminal box for a solar cell module according to the present invention.

As shown in FIG. 6, projecting portions 607 were formed on part of a surface of a lid member 605 which would come into contact with a box member 602. Recessed portions 606 were formed in the upper surface of the box member 602 to correspond to the projecting portions 607. Since the lid member had the projecting portions, the box member had the recessed portions, and the projecting portions and recessed portions fitted with each other when the lid member was mounted on a solar cell module 600 with an adhesive 608, the lid member was set and held still at the fixed position. As a result, the lid member did not displace or float from the box member or was not urged against the box member before the adhesive dried, and the adhesion force required by the design was reliably obtained.

(Example 5)

In Example 1, a lead wire 101 and an outer lead wire 105 were electrically connected to each other in a box member 103, and the box member 103 was fixed on a solar cell module 100 with a double-sided adhesive tape 102. Thereafter, the box member 103 was filled with silicone potting agent "CY 51-038" manufactured by Torei Dow Corning K.K. Except for this, Example 5 was identical to Example 1. With this arrangement, insulation and mechanical protection of the terminal portion were further improved.

(Example 6)

Figure 7:
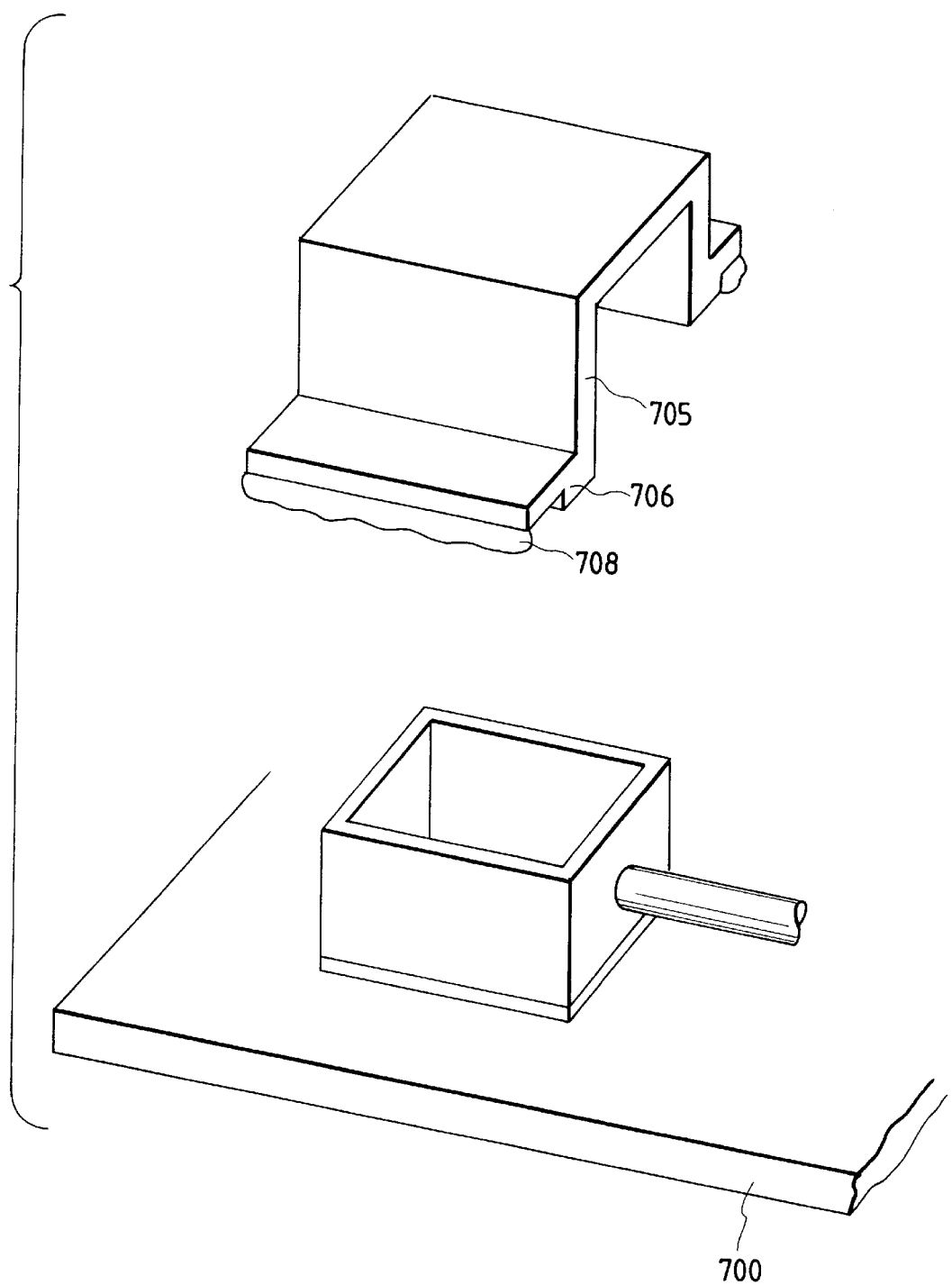
FIG. 7 shows the structure of a terminal box for a solar cell module according to the present invention.

As shown in FIG. 7, projecting portions 706 were formed on part of a surface of a lid member 705 that would come into contact with a solar cell module 700. Since the projecting portions were formed on the adhesion surface of the lid member and the lid member was adhered by butting, an adhesive 708 was set to a desired thickness, thereby reliably obtaining an adhesion force.

(Example 7)

Figure 9:
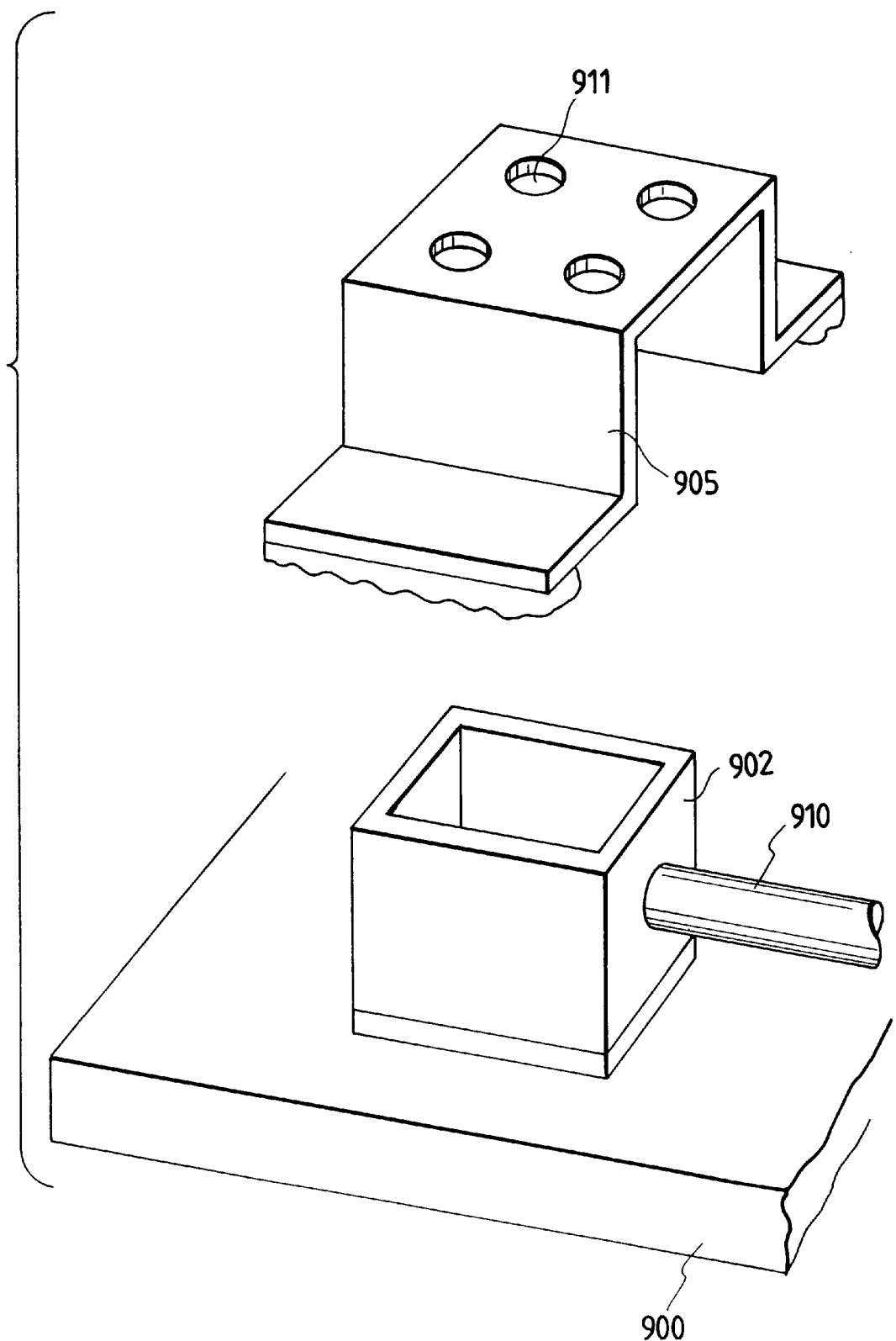
FIG. 9 shows the structure of a terminal box for a solar cell module according to the present invention.

As shown in FIG. 9, through holes 911 were formed in the upper surface of a lid member 905. Water generated in a box member 902 by condensation or the like was discharged through the through holes 911. The electrical insulation properties of connection between the power extracting portion of a solar cell module 900 and an outer lead wire 910 were thus improved.

[Effect of the Invention]

When the terminal box for the solar cell module has this arrangement, the workability is improved when mounting the terminal box on the solar cell module. In particular, after the box member is mounted, the inspection process can be started immediately without waiting for the adhesive to be dried, so that the work time in the manufacture line is greatly shortened. After this, the lid member is adhered to perform insulation and mechanical protection of the electrical connecting portion. Also, the adhesion force required by the design can be obtained reliably between the terminal box and the solar cell module.

What is claimed is:

1. A solar cell module wherein a box member having an open upper surface and having therein an electrical connecting portion between a solar cell element of said solar cell module and an outer lead wire is adhered to said solar cell module at a bottom surface of said box member with a pressure-sensitive adhesive, and a lid member disposed so as to cover said open upper surface of said box member is adhered to said solar cell module with an adhesive other than said pressure-sensitive adhesive.

2. A module according to claim 1, wherein said box member has a locking projecting portion on a side surface thereof, and said lid member has a locking portion corresponding to said locking projecting portion.

3. A module according to claim 1, wherein said lid member has a locking projecting portion on a side surface thereof, and said box member has a locking portion corresponding to said locking projecting portion.

4. A module according to claim 1, wherein said box member has a projecting portion on said upper surface thereof, and said lid member has a hole portion corresponding to said projecting portion.

5. A module according to claim 1, wherein said box member has a recessed portion in said upper surface thereof, and said lid member has a projecting portion corresponding to said recessed potion.

6. A module according to claim 1, wherein a bottom portion of said lid member has a surface which is in contact with said solar cell module, and a surface which is coated with said adhesive other than said pressure-sensitive adhesive.

7. A module according to claim 1, wherein the interior of said box member is filled with a filler.

8. A module according to claim 7, wherein said lid member has a through hole in an upper surface thereof.

9. A module according to claim 1, wherein said pressure-sensitive adhesive is a double-sided adhesive tape.

10. A module according to claim 1, wherein said solar cell module has at least a reinforcing plate, a filler, said solar cell element, and a protective film.

11. A method of manufacturing a solar cell module, comprising the steps of adhering a box member having an open upper surface and an opening portion in a bottom surface thereof to said solar cell module with a pressure-sensitive adhesive, electrically connecting an outer lead wire fixed to a side surface of said box member to an output terminal of said solar cell module, and adhering a lid member disposed so as to cover said open upper surface of said box member to said solar cell module with an adhesive other than said pressure-sensitive adhesive.

12. A method according to claim 11, further comprising, between the step of electrically connecting said outer lead wire and said output terminal to each other and the step of adhering said lid member, the step of inspecting the output from said solar cell module.

13. A method according to claim 11, wherein the step of electrically connecting said outer lead wire and said output terminal to each other includes the steps of connecting an inner lead wire to said output terminal and connecting said inner lead wire and said outer lead wire to each other.

14. A building material wherein a box member having an open upper surface and having therein an electrical connecting portion between a solar cell element of a solar cell module and an outer lead wire is adhered to said solar cell module at a bottom surface of said box member with a pressure-sensitive adhesive, and a lid member disposed so as to cover said open upper surface of said box member is adhered to said solar cell module with an adhesive other than said pressure-sensitive adhesive.

15. A building material according to claim 14, wherein said lid member has a through hole in an upper surface thereof.

16. A method of connecting a building material, comprising the steps of connecting a plurality of building materials according to claim 14 to each other, and connecting connectors, each formed on one end of said outer lead wire, to each other.

17. A solar power generation apparatus comprising a solar cell module and an inverter for controlling an output from said solar cell module, said solar cell module being arranged such that a box member having an open upper surface and having therein an electrical connecting portion between a solar cell element of said solar cell module and an outer lead wire is adhered to said solar cell module at a bottom surface of said box member with a pressure-sensitive adhesive, and a lid member disposed so as to cover said open upper surface of said box member is adhered to said solar cell module with an adhesive other than said pressure-sensitive adhesive.

18. A solar cell module comprising a solar cell module body comprising a solar cell element, an outer lead wire for taking the power generated by said solar cell element out of said solar cell module body, a box member having an open upper surface and having therein a portion for electrically connecting said solar cell element and said outer lead wire, a lid member disposed so as to cover said open upper surface of said box member, wherein said box member is affixed to said solar cell module body at a bottom surface of said box member with a first adhesive, and wherein said lid member is adhered and fixed to said solar cell module body with a second adhesive other than said first adhesive.

19. The solar cell module according to claim 18, wherein said second adhesive is further arranged between said lid member and said box member.

20. The solar cell module according to claim 18, wherein said box member has a locking projecting portion on a side surface thereof, and wherein said lid member has a locking recessed portion corresponding to said locking projecting portion.

21. The solar cell module according to claim 18, wherein said lid member has a locking projecting portion on a side surface thereof, and wherein said box member has a locking recessed portion corresponding to said locking projecting portion.

22. The solar cell module according to claim 18, wherein said box member has a projecting portion on said upper surface thereof, and wherein said lid member has a hole portion corresponding to said projecting portion.

23. The solar cell module according to claim 18, wherein said box member has a recessed portion in said upper surface thereof, and wherein said lid member has a projecting portion corresponding to said recessed portion.

24. The solar cell module according to claim 18, wherein a bottom portion of said lid member has a surface in contact with said solar cell module, and another surface in contact with said adhesive.

25. The solar cell module according to claim 18, wherein the inside of said box member is filled with a filler.

26. The solar cell module according to claim 25, wherein said lid member has a through hole in an upper surface thereof.

27. The solar cell module according to claim 18, wherein said first adhesive is a double-sided adhesive tape.

28. The solar cell module according to claim 18, wherein said solar cell module further comprises a reinforcing plate, a filler and a protective film.

29. The solar cell module according to claim 18, wherein said lid member is disposed so as to cover the entire upper surface of said box member.

30. The solar cell module according to claim 18, wherein said lid member is adhered to said solar cell module body so as to bridge over said box member.

31. A method of manufacturing a solar cell module, comprising the steps of:

adhering a box member having an open upper surface and an opening portion in a bottom surface thereof to a solar cell module body having a solar cell element with a first adhesive; and adhering and then fixing with a second adhesive other than said first adhesive a lid member having a portion extending over the upper surface of said box member to said solar cell module body.

32. The method according to claim 31, further comprising the step of electrically connecting said solar cell element and an output terminal for taking an output from said solar cell element outside and an outer lead wire for guiding the output out of said solar cell module, and further comprising between the connecting step and the step adhering and then fixing said lid member, the step of inspecting an output from said solar cell module.

33. The method according to claim 32, wherein the step of electrically connecting said outer lead wire and said output terminal to each other comprises the steps of connecting an inner lead wire of said solar cell module to said output terminal and connecting said inner lead wire and said outer lead wire to each other.

34. The method according to claim 31, wherein said lid member is disposed so as to cover the entire upper surface of said box member.

35. The method according to claim 31, wherein said lid member is adhered and fixed to said solar cell module body so as to bridge over said box member.

36. The method according to claim 31, wherein the step of adhering said lid member comprises locking between said lid member and said box member.

37. The method according to claim 31, wherein the step of adhering said lid member comprises insertion between said lid member and said box member.

38. The method according to claim 31, wherein the step of adhering and then fixing said lid member comprises adhering and fixing said lid member to said box member with said second adhesive.

39. The method according to claim 31, further comprising the step of filling a space inside said box member with a filler.

40. A building material comprising a solar cell module comprising a solar cell module body comprising a solar cell element, a box member having an open upper surface and having therein a portion for electrically connecting said solar cell element and an outer lead wire for taking an output from said solar cell element outside, said box member being adhered to said solar cell module body at a bottom surface of said box member with a first adhesive, and a lid member adhered and fixed to said solar cell module body with a second adhesive other than said first adhesive so as to cover said open upper surface of said box member.

41. The building material according to claim 40, wherein said lid member has a through hole in an upper surface thereof.

42. A method of connecting a building material, comprising the steps of connecting a plurality of the building materials as set forth in claim 40 to each other, and connecting connectors, each formed on one end of said outer lead wire, to each other.

43. A solar power generation apparatus comprising a solar cell module and an inverter for controlling an output from said solar cell module, said solar cell module comprising a solar cell module body comprising a solar cell element, an outer lead wire for taking an output from said solar cell element out of said solar cell module, a box member, having an open upper surface and having therein a portion for electrically connecting said solar cell element and said outer lead wire, adhered to said solar cell module body at a bottom surface of said box member with a first adhesive, and a lid member, disposed so as to cover said open upper surface of said box member, adhered and fixed to said solar cell module body with a second adhesive other than said first adhesive.

* * * * *